US012213365B2

(12) United States Patent
Cho et al.

(10) Patent No.: US 12,213,365 B2
(45) Date of Patent: Jan. 28, 2025

(54) DISPLAY DEVICE AND PHOTOMASK FOR DEFINING OPENING IN THE DISPLAY DEVICE

(71) Applicant: Samsung Display Co., LTD., Yongin-si (KR)

(72) Inventors: Jung-Hyun Cho, Seoul (KR); Chi Wook An, Hwaseong-si (KR); Kang Wook Heo, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 263 days.

(21) Appl. No.: 17/409,908

(22) Filed: Aug. 24, 2021

(65) Prior Publication Data
US 2022/0231089 A1    Jul. 21, 2022

(30) Foreign Application Priority Data
Jan. 21, 2021   (KR) .................... 10-2021-0008826

(51) Int. Cl.
| | |
|---|---|
| *H10K 59/40* | (2023.01) |
| *G03F 1/32* | (2012.01) |
| *G06F 3/041* | (2006.01) |
| *H10K 50/858* | (2023.01) |
| *H10K 59/122* | (2023.01) |

(52) U.S. Cl.
CPC .............. *H10K 59/40* (2023.02); *G03F 1/32* (2013.01); *G06F 3/0412* (2013.01); *H10K 50/858* (2023.02); *H10K 59/122* (2023.02)

(58) Field of Classification Search
CPC ...................... H10K 59/122; H10K 50/858
See application file for complete search history.

(56) References Cited

U.S. PATENT DOCUMENTS

| | | | |
|---|---|---|---|
| 6,072,450 A | 6/2000 | Yamada et al. | |
| 7,535,646 B2 | 5/2009 | Chari et al. | |
| 7,985,476 B2 | 7/2011 | Kurino et al. | |
| 9,142,802 B2 | 9/2015 | Miyamoto et al. | |
| 10,033,014 B2 | 7/2018 | Chen et al. | |
| 10,050,236 B2 | 8/2018 | Chen et al. | |

(Continued)

FOREIGN PATENT DOCUMENTS

| | | | | |
|---|---|---|---|---|
| CN | 11-1312066 | * | 6/2020 | ............... G09F 9/00 |
| JP | 2000322000 | | 11/2000 | |

(Continued)

*Primary Examiner* — Lauren Nguyen
(74) *Attorney, Agent, or Firm* — CANTOR COLBURN LLP

(57) ABSTRACT

A display device includes a substrate, a pixel electrode disposed on the substrate, a bank layer which is disposed on the pixel electrode and in which a pixel opening overlapping the pixel electrode is defined, an encapsulation layer disposed on the pixel electrode and the bank layer, a sensing electrode disposed on the encapsulation layer, a first insulating layer which is disposed on the sensing electrode and in which an opening overlapping the pixel opening is defined, and a second insulating layer which is disposed on the first insulating layer and has a higher refractive index than a refractive index of the first insulating layer, where a side inclination angle of the first insulating layer in the opening of the first insulating layer is different depending on a position of the opening of the first insulating layer.

12 Claims, 27 Drawing Sheets

(56) References Cited

U.S. PATENT DOCUMENTS

2015/0333108 A1 11/2015 Miyamoto et al.
2019/0165061 A1* 5/2019 Jung .................... H10K 50/858

FOREIGN PATENT DOCUMENTS

| | | |
|---|---:|---:|
| JP | 2004039500 | 2/2004 |
| JP | 4664447 | 4/2011 |
| JP | 4933553 | 5/2012 |
| KR | 101074804 | 10/2011 |
| KR | 101084178 | 11/2011 |
| KR | 101248904 | 3/2013 |
| KR | 101532056 | 6/2015 |
| KR | 1020150145834 | 12/2015 |
| KR | 1020160017397 | 2/2016 |
| KR | 1020160034457 | 3/2016 |
| KR | 101643009 | 7/2016 |
| KR | 1020170051676 | 5/2017 |
| KR | 1020180005323 | 1/2018 |
| KR | 1020180125674 | 11/2018 |
| KR | 1020180133992 | 12/2018 |
| KR | 1020190004863 | 1/2019 |
| KR | 1020190041558 | 4/2019 |
| KR | 1020190062678 | 6/2019 |
| KR | 1020190087689 | 7/2019 |
| KR | 1020190103551 | 9/2019 |
| KR | 102028025 | 10/2019 |
| KR | 102090276 | 3/2020 |
| KR | 1020200058643 | 5/2020 |
| KR | 102150011 | 9/2020 |
| KR | 102189819 | 12/2020 |
| KR | 1020200141421 | 12/2020 |

\* cited by examiner

DISPLAY DEVICE AND PHOTOMASK FOR DEFINING OPENING IN THE DISPLAY DEVICE

This application claims priority to Korean Patent Application No. 10-2021-0008826, filed on Jan. 21, 2021, and all the benefits accruing therefrom under 35 U.S.C. § 119, the content of which in its entirety is herein incorporated by reference.

BACKGROUND

1. Field

Embodiments of the invention relate to a display device and a photomask used in a manufacturing process thereof.

2. Description of the Related Art

A display device displays an image, and includes various types of display devices such as a liquid crystal display device, an organic light emitting diode display device, and the like. Such a display device is used in various electronic devices such as mobile phones, navigation units, digital cameras, electronic books, portable game machines, and various terminals.

The display device is formed to have a multi-layered structure. The display device may have a multi-layered structure in which a light emitting element, a touch sensor, and the like are stacked on a substrate, for example. An image may be displayed by light generated from the light emitting element passing through such layers and being emitted to the outside of the display device.

SUMMARY

Some of light generated by a light emitting element may disappear without being emitted to the outside, such as being reflected at an interlayer interface. As a result, front light emission efficiency and display quality of the display device may be deteriorated.

Embodiments have been made in an effort to provide a display device and a photomask used in a manufacturing process thereof, capable of improving light emission efficiency and display quality.

In addition, a pattern constituting the display device may include a substantially uniform pattern with a small thickness, thereby improving stability in a foldable product etc.

An embodiment provides a display device including a substrate, a pixel electrode disposed on the substrate, a bank layer which is disposed on the pixel electrode and in which a pixel opening overlapping the pixel electrode is defined, an encapsulation layer disposed on the pixel electrode and the bank layer, a sensing electrode disposed on the encapsulation layer, a first insulating layer which is disposed on the sensing electrode and in which an opening overlapping the pixel opening is defined, and a second insulating layer which is disposed on the first insulating layer and has a higher refractive index than a refractive index of the first insulating layer, where a side inclination angle of the first insulating layer in the opening of the first insulating layer is different depending on a position of the opening of the first insulating layer.

In an embodiment, an edge of the opening of the first insulating layer may include a first region and a second region in a plan view, and a side inclination angle of the first insulating layer in the first region may be smaller than a side inclination angle of the first insulating layer in the second region.

In an embodiment, the opening of the first insulating layer may have a polygonal shape, the first region may be a corner portion of the polygonal shape, and the second region may be a portion other than the first region.

In an embodiment, the opening of the first insulating layer may have the polygonal shape in which a corner portion thereof is chamfered.

In an embodiment, the pixel opening may be defined in the opening of the first insulating layer in a plan view.

In an embodiment, a distance between the pixel opening and the opening of the first insulating layer in the first region may be greater than a distance between the pixel opening and the opening of the first insulating layer in the second region.

In an embodiment, a ratio of the first region to the second region at the edge of the opening of the first insulating layer may be less than 1.

In an embodiment, the side inclination angle of the first insulating layer in the first region may be smaller than the side inclination angle of the first insulating layer in the second region by about 20 degrees or more.

In an embodiment, the first insulating layer in the first region may have the side inclination angle of about 70 degrees or less.

In an embodiment, the first insulating layer in the second region may have the side inclination angle of about 50 degrees or more and about 90 degrees or less.

In an embodiment, the opening of the first insulating layer may have a polygonal shape, the first region may be a central portion of each side of the polygonal shape, and the second region may be a portion other than the first region.

In an embodiment, a side inclination of the first insulating layer may have a straight line, a curved line, or a stepped shape.

An embodiment provides a photomask including a center pattern having a polygonal shape, and a peripheral pattern disposed at a corner portion of the center pattern, where the peripheral pattern extends in a direction that is parallel or perpendicular to the corner portion.

In an embodiment, the peripheral pattern may include a plurality of rod shapes extended in a direction that is parallel to the corner portion, and lengths of the plurality of rod shapes may be constant or may gradually increase as a distance from the center pattern increases.

In an embodiment, a distance between adjacent rod shapes of the plurality of rod shapes may be constant or gradually increase as the distance from the center pattern increases.

In an embodiment, a width of the plurality of rod shapes may be constant or may gradually decrease as the distance from the center pattern increases.

In an embodiment, the center pattern may be a full tone pattern, and the peripheral pattern may be a halftone pattern and may have a trapezoidal shape having a width that gradually increases as a distance from the center pattern increases.

An embodiment provides a display device including a substrate, a pixel electrode disposed on the substrate, a bank layer which is disposed on the pixel electrode and in which a pixel opening overlapping the pixel electrode is defined, an encapsulation layer disposed on the pixel electrode and the bank layer, a sensing electrode disposed on the encapsulation layer, a first insulating layer which is disposed on the sensing electrode and in which an opening overlapping the pixel opening is defined, and a second insulating layer which is disposed on the first insulating layer and has a higher refractive index than a refractive index of the first insulating layer, where a side inclination angle of the bank layer in the opening of the bank layer is different depending on a position of the opening of the first insulating layer.

In an embodiment, an edge of the pixel opening may include the first region and the second region in a plan view, and a side inclination angle of the pixel opening in the first region may be smaller than a side inclination angle of the pixel opening in the second region.

In an embodiment, the pixel opening may have a polygonal shape, the first region may be a corner portion of the polygonal shape, and the second region may be a portion other than the first region.

By the embodiments, it is possible to improve the light emission efficiency and display quality of the display device.

In addition, the pattern constituting the display device may be uniformly formed with a thin thickness, thereby reducing the overall thickness of the display device and stably being used for foldable products.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
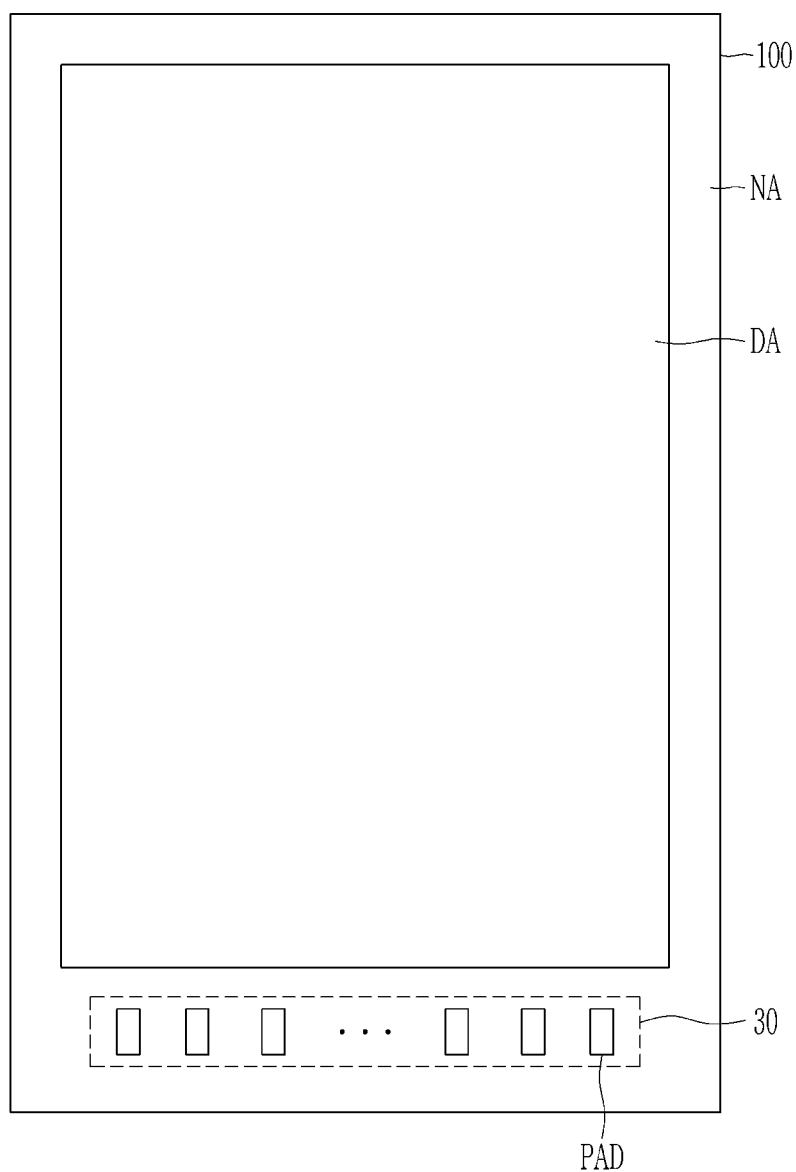
FIG. 1 illustrates a schematic top plan view of an embodiment of a display device.

Embodiments of the invention will be described more fully hereinafter with reference to the accompanying drawings, in which embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that, when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

It will be understood that, although the terms "first," "second," "third" etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, a display device in an embodiment will be described with reference to FIG. 1 and FIG. 2.

Figure 2:
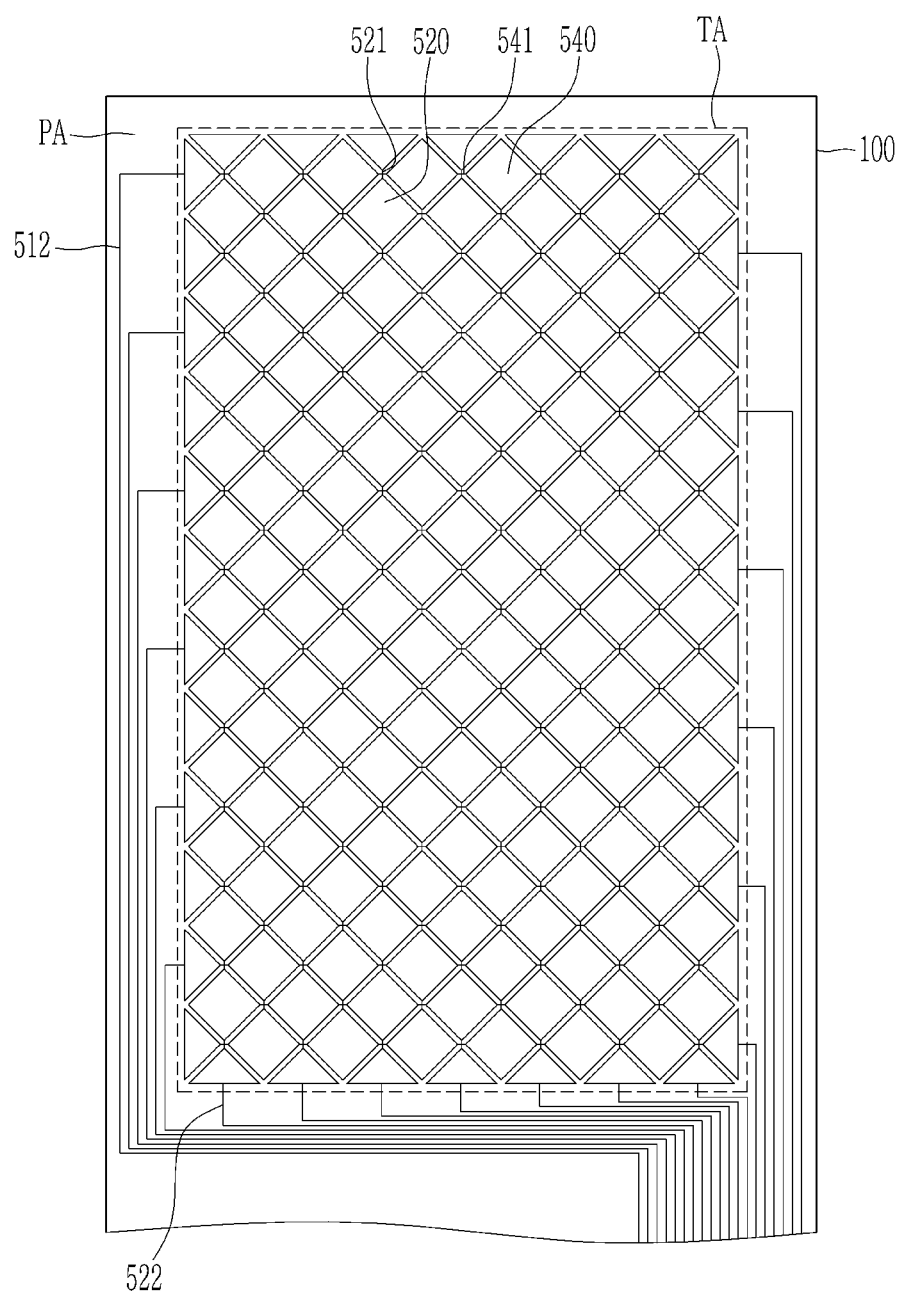
FIG. 2 illustrates a top plan view of an embodiment of a portion including a sensor in a display device.

FIG. 1 illustrates a schematic top plan view of an embodiment of a display device, and FIG. 2 illustrates a top plan view of an embodiment of a portion including a sensor in a display device.

As illustrated in FIG. 1, the display device in the illustrated embodiment includes a substrate 100 and a pad portion 30.

The substrate 100 includes a display area DA and a non-display area NA. The display area DA is an area in which pixels including a light emitting diode and a transistor display an image thereon, and the non-display area NA is an area in which an image is not displayed. The non-display area NA may surround a periphery of the display area DA. The non-display area NA is an area including the pad portion 30 in which pads PAD for applying driving signals to pixels are formed or provided.

A plurality of pixels (not illustrated) each including a transistor, a light emitting diode, or the like may be disposed in the display area DA. The pixels may be arranged in various forms, for example, may be arranged in a matrix form. A sensing area TA including a plurality of sensing electrodes 520 and 540 in FIG. 2 may be further disposed above the display area DA to recognize a touch.

In the non-display area NA, a driving voltage line (not illustrated), a driving low voltage line (not illustrated), and the pad portion 30 may transfer driving signals such as voltages and signals to pixels formed or disposed in the display area DA. In addition, a plurality of sensing wires 512 and 522 (refer to FIG. 2) may be further disposed in the non-display area NA. The sensing wires 512 and 522 may be connected to the sensing electrodes 520 and 540. The sensing wires 512 and 522 and the sensing electrodes 520 and 540 will be further described below with reference to FIG. 2.

The pad portion 30 is disposed in a portion of the non-display area NA, and includes a plurality of pads PAD. Voltages, signals, etc., may be applied to a plurality of voltage lines (not illustrated) connected to the display area DA through the pads PAD, and the sensing wires 512 and 522 (refer to FIG. 2). A flexible printed circuit board ("FPCB") (not illustrated) may be attached to the non-display area NA. The FPCB may be electrically connected to the pad portion 30. The FPCB and the pad portion 30 may be electrically connected by an anisotropic conductive film. The FPCB may include an integrated chip (not illustrated), and a driving signal outputted from the driving integrated circuit may be supplied to each pixel through the pads PAD of the pad portion 30.

As illustrated in FIG. 2, the substrate 100 further includes a sensing area TA in which the sensing electrodes 520 and 540 are formed or disposed at an upper portion of the display area DA, and a peripheral area PA surrounding the sensing area TA. In an embodiment, the sensing area TA may include the display area DA and a partial area of the non-display area NA of FIG. 1, and the peripheral area PA may include a remaining area excluding the sensing area TA. However, this is merely an example, and positions of the sensing area TA and the peripheral area PA may be variously changed. In an embodiment, the sensing area TA may include a portion of the display area DA, and the peripheral area PA may include a remaining area of the display area DA excluding the sensing region TA, and a non-display area NA, for example. In an alternative embodiment, the sensing area TA may include a display area DA and a non-display area NA.

The sensing area TA may include the sensing electrodes 520 and 540. The sensing electrodes 520 and 540 may include a plurality of first sensing electrodes 520 and a plurality of second sensing electrodes 540.

The first sensing electrodes 520 and the second sensing electrodes 540 may be electrically separated from each other. In an embodiment, the first sensing electrodes 520 may be sensing input electrodes, and the second sensing electrodes 540 may be sensing output electrodes. However, the invention is not limited thereto, and the first sensing electrodes 520 may be the sensing output electrodes, and the second sensing electrodes 540 may be the sensing input electrodes.

The first sensing electrodes 520 and the second sensing electrodes 540 may be alternately distributed so as to not overlap each other in the sensing area TA, and may be disposed in a mesh form. The first sensing electrodes 520 may be disposed in plural in a column direction and may be disposed in plural in a row direction, and the second sensing electrode 540 may also be disposed in plural in the column direction and may be disposed in plural in the row direction. The first sensing electrodes 520 may be connected to each other in the column direction by a plurality of first sensing electrode connectors 521, and the second sensing electrodes 540 may be connected to each other in the row direction by a plurality of second sensing electrode connectors 541.

The first sensing electrodes 520 and the second sensing electrodes 540 may be disposed in a same layer. In an embodiment, the first sensing electrodes 520 and the second sensing electrodes 540 may be disposed in different layers. The first sensing electrodes 520 and the second sensing electrodes 540 may have a rhombus shape, but the invention is not limited thereto. The first sensing electrode 520 and the second sensing electrode 540 may have a polygonal shape such as a quadrangle or a hexagon, or a circular or elliptical shape, and may be embodied in various shapes such as having a protrusion to improve sensitivity of a sensor. The first sensing electrodes 520 and the second sensing electrodes 540 may be formed or provided as a transparent conductor or an opaque conductor. In an embodiment, the first sensing electrodes 520 and the second sensing electrodes 540 may include a transparent conductive oxide ("TCO"), and the TCO may include at least one of an indium tin oxide ("ITO"), an indium zinc oxide ("IZO"), a zinc oxide (ZnO), a carbon nanotube ("CNT"), and graphene, for example. In addition, a plurality of openings may be defined in the first sensing electrodes 520 and the second sensing electrodes 540. The openings defined in the sensing electrodes 520 and 540 serve to allow light emitted from a light emitting diode to be emitted to the front without interference.

The first sensing electrodes 520 may be electrically connected to each other by the first sensing electrode connectors 521 (also referred to as bridges), and the second sensing electrodes 540 may be electrically connected to each other by the second sensing electrode connectors 541. When the first sensing electrodes 520 are connected to each other in a first direction, the second sensing electrodes 540 may be connected to each other in a second direction intersecting the first direction. When the first sensing electrodes 520 and the second sensing electrodes 540 are disposed in a same layer, one of the first sensing electrode connectors 521 and the second sensing electrode connectors 541 may be disposed at the same layer as that of the first sensing electrodes 520 and the second sensing electrodes 540, and the other one may be disposed at a different layer from that of the first sensing electrodes 520 and the second sensing electrodes 540. As a result, the first sensing electrodes 520 and the second sensing electrodes 540 may be electrically separated. The sensing electrode connector disposed in the different layer may be disposed at an upper layer or a lower layer of the first sensing electrodes 520 and the second sensing electrodes 540, and in embodiments described below, descriptions will be made focusing on an embodiment in which the sensing electrode connector is disposed on the lower layer, i.e., a layer closer to the substrate.

The sensing wires 512 and 522 are respectively connected to the first sensing electrodes 520 and the second sensing electrodes 540 in the peripheral area PA. The sensing wires 512 and 522 may include the first sensing wires 512 and the second sensing wires 522. The first sensing wire 512 may be connected to the second sensing electrodes 540 disposed in the row direction, and the second sensing wire 522 may be connected to the first sensing electrodes 520 disposed in the column direction. In an embodiment, the first sensing wire 512 and the second sensing wire 522 may be electrically connected to some of the pads PAD included in the pad portion 30 of FIG. 1.

In FIG. 2, a sensor of a mutual-cap type that senses a touch using two sensing electrodes 520 and 540 is illustrated. However, in an embodiment, it may be formed or provided as a sensor of self-cap type that senses a touch using only one sensing electrode.

Figure 3:
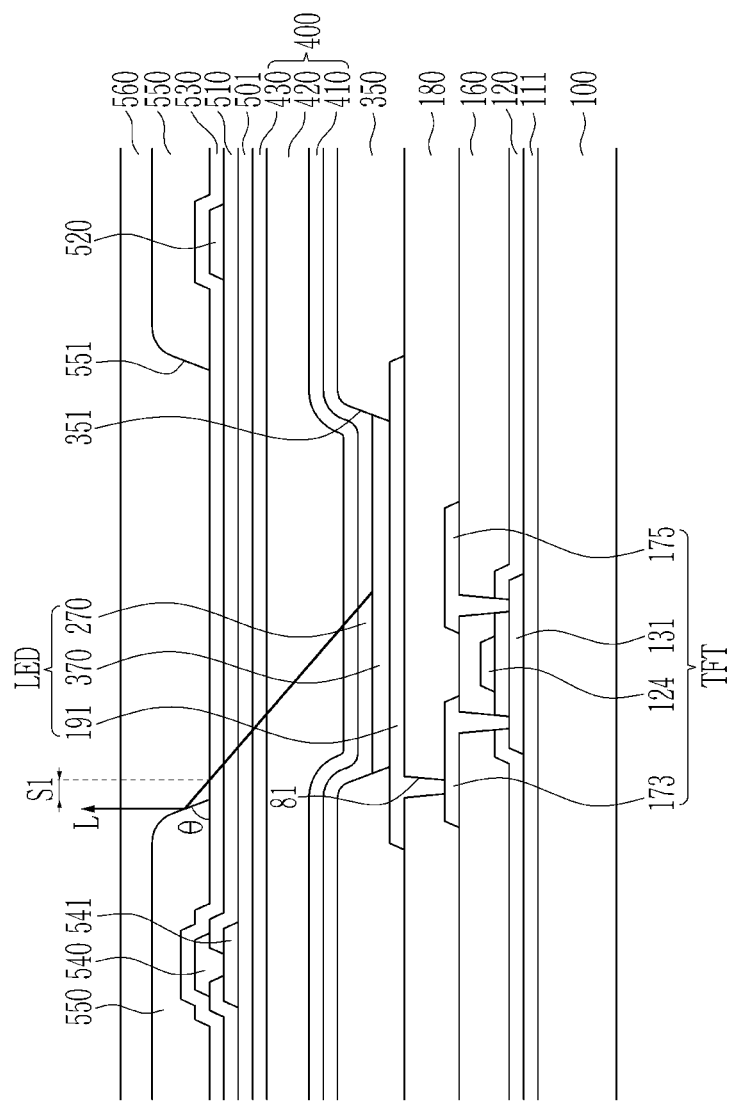
FIG. 3 illustrates a cross-sectional view showing a portion of an embodiment of a display area in a display device.

Hereinafter, a display device in an embodiment will be further described with reference to FIG. 3 illustrating a cross-sectional view in the display area DA.

FIG. 3 illustrates a cross-sectional view showing an embodiment of a portion of a display area in a display device.

As illustrated in FIG. 3, in the display device in the illustrated embodiment, the display area DA may include a substrate 100, a semiconductor layer 131, a transistor TFT including a gate electrode 124, a source electrode 173, and a drain electrode 175, a gate insulating layer 120, a first inter-insulating layer 160, a second inter-insulating layer 180, a pixel electrode 191, an emission layer 370, a bank layer 350, a common electrode 270, and an encapsulation layer 400. Herein, the pixel electrode 191, the emission layer 370, and the common electrode 270 may constitute a light emitting diode LED. In addition, the display device further includes the sensing area TA disposed at an upper portion of the display area DA, and the sensing area TA includes a first sensing insulating layer 510, the sensing electrodes 520 and 540, and the second sensing electrode connectors 541. In addition, the display device may further include a first insulating layer 550 and a second insulating layer 560 disposed above the sensing area TA.

The substrate 100 may include a material having a rigid characteristic such as glass, or a flexible material such as plastic or polyimide that is bendable. A buffer layer 111 for flattening a surface of the substrate 100 and blocking penetration of impurity elements may be further disposed on the substrate 100. In an embodiment, the buffer layer 111 may include an inorganic material, and for example, may include an inorganic insulating material such as a silicon nitride ($SiN_x$), a silicon oxide ($SiO_x$), and a silicon oxynitride ($SiO_xN_y$). The buffer layer 111 may have a single layer structure or a multi-layered structure of the material. A barrier layer (not illustrated) may be further disposed on the substrate 100. In this case, the barrier layer may be disposed between the substrate 100 and the buffer layer 111. The barrier layer may include an inorganic insulating material such as a silicon nitride ($SiN_x$), a silicon oxide ($SiO_x$), and a silicon oxynitride ($SiO_xN_y$). The barrier layer may have a single layer structure or a multi-layered structure of the material.

The semiconductor layer 131 may be disposed on the substrate 100. The semiconductor layer 131 may include any one of amorphous silicon, polycrystalline silicon, and an oxide semiconductor. In an embodiment, the semiconductor layer 131 may include low temperature polysilicon ("LTPS"), or may include an oxide semiconductor material including at least one of zinc (Zn), indium (In), gallium (Ga), tin (Sn), and a combination thereof, for example. In an embodiment, the semiconductor layer 131 may include an indium-gallium-zinc oxide ("IGZO"). The semiconductor layer 131 may include a channel region, a source region, and a drain region into which it is classified depending on whether or not doped with impurities. The source region and the drain region may have a conductive characteristic corresponding to a conductor.

The gate insulating layer 120 may cover the semiconductor layer 131 and the substrate 100. In an embodiment, the gate insulating layer 120 may include an inorganic insulating material such as a silicon nitride ($SiN_x$), a silicon oxide ($SiO_x$), and a silicon oxynitride ($SiO_xN_y$). The gate insulating layer 120 may have a single layer structure or a multi-layered structure of the material.

The gate electrode 124 may be disposed on the gate insulating layer 120. In an embodiment, the gate electrode 124 may include a metal such as copper (Cu), molybdenum (Mo), aluminum (Al), silver (Ag), chromium (Cr), or tantalum (Ta), or a metal alloy thereof. The gate electrode 124 may be formed or provided as a single layer or a multilayer. A region of the semiconductor layer 131 that overlaps the planar gate electrode 124 may be a channel region.

The first inter-insulating layer 160 may cover the gate electrode 124 and the gate insulating layer 120. In an embodiment, the first inter-insulating layer 160 may include an inorganic insulating material such as a silicon nitride ($SiN_x$), a silicon oxide ($SiO_x$), and a silicon oxynitride ($SiO_xN_y$). The first inter-insulating layer 160 may have a single layer structure or a multi-layered structure of the material.

The source electrode 173 and the drain electrode 175 are disposed on the first inter-insulating layer 160. The source electrode 173 and the drain electrode 175 may be connected to the source region and the drain region of the semiconductor layer 131 through openings defined in the first inter-insulating layer 160 and the gate insulating layer 120, respectively. Accordingly, the semiconductor layer 131, the gate electrode 124, the source electrode 173, and the drain electrode 175 described above constitute one transistor TFT, e.g., one thin film transistor. In an embodiment, the transistor TFT may include only the source region and the drain region of the semiconductor layer 131 instead of the source electrode 173 and the drain electrode 175.

In an embodiment, the source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof. The source electrode 173 and the drain electrode 175 may be formed or provided as a single layer or a multilayer. The source electrode 173 and the drain electrode 175 in an embodiment may be configured as a triple layer including an upper layer, an intermediate layer, and a lower layer, the upper layer and the lower layer may include titanium (Ti), and the intermediate layer may include aluminum (Al).

The second inter-insulating layer 180 may be disposed on the source electrode 173 and the drain electrode 175. The second inter-insulating layer 180 covers the source electrode 173, the drain electrode 175, and the first inter-insulating layer 160. The second inter-insulating layer 180, which is for planarizing a surface of the substrate 100 provided with the transistor TFT, may be an organic insulating layer, and may include at least one material of a polyimide, a polyamide, an acrylic resin, benzocyclobutene, and a phenol resin.

The pixel electrode 191 may be disposed on the second inter-insulating layer 180. The pixel electrode 191 is also referred to as an anode, and may be formed or provided as a single layer including a transparent conductive oxide film, a metal material, or as multiple layers including them. In an embodiment, the transparent conductive oxide layer may include an ITO, a poly-ITO, an IZO, an indium gallium zinc oxide ("IGZO"), an indium tin zinc oxide ("ITZO"), or the like. In an embodiment, the metal material may include silver (Ag), molybdenum (Mo), copper (Cu), gold (Au), and aluminum (Al).

A via hole 81 exposing the drain electrode 175 may be defined in a second inter-insulating layer 180. The drain electrode 175 and the pixel electrode 191 may be physically and electrically connected through the via hole 81 of the second inter-insulating layer 180. Accordingly, the pixel electrode 191 may receive an output current to be transferred from the drain electrode 175 to the emission layer 370.

The bank layer 350 may be disposed on the pixel electrode 191 and the second inter-insulating layer 180. The bank layer 350 is also referred to as a pixel defining layer ("PDL"), and a pixel opening 351 overlapping at least a portion of the pixel electrode 191 is defined in the bank layer 350. In this case, the pixel opening 351 may overlap a central portion of the pixel electrode 191, and may not overlap an edge portion of the pixel electrode 191. As a result, a size of the pixel opening 351 may be smaller than that of the pixel electrode 191. The bank layer 350 may define a formation position of the emission layer 370 such that the emission layer 370 may be disposed on a portion thereof where an upper surface of the pixel electrode 191 is exposed. The bank layer 350 may be formed or provided as an organic insulator including at least one material of a polyimide, a polyamide, an acryl resin, benzocyclobutene, and a phenol resin. In an embodiment, the bank layer 350 may be formed or provided as a black pixel define layer ("BPDL") including a black pigment.

The emission layer 370 may be disposed within the pixel opening 351 defined by the bank layer 350. The emission layer 370 may include an organic material that emits light such as red, green, and blue light. The emission layer 370 emitting red, green, and blue light may include a low molecular weight or high molecular weight organic material. In FIG. 3, the emission layer 370 is illustrated as a single layer, but in practice, an auxiliary layer such as an electron injection layer, an electron transport layer, a hole transport layer, and a hole injection layer may be included above and below the emission layer 370, where the hole injection layer and the hole transport layer may be disposed below the emission layer 370, and the electron transport layer and the electron injection layer may be disposed above the emission layer 370.

The common electrode 270 may be disposed on the bank layer 350 and the emission layer 370. In an embodiment, the common electrode 270 may be also referred to as a cathode, and may include a transparent conductive layer including an ITO, an IZO, an IGZO, an ITZO, etc. In addition, the common electrode 270 may have a translucent characteristic, and in this case, it may constitute a micro-cavity together with the pixel electrode 191. According to such a micro-cavity structure, light of a predetermined wavelength is emitted to an upper part by the characteristics and spacing between both of the electrodes, and as a result, red, green, or blue light may be displayed.

The encapsulation layer 400 may be disposed on the common electrode 270. The encapsulation layer 400 may include at least one inorganic layer and at least one organic layer. In the illustrated embodiment, the encapsulation layer 400 may include a first inorganic encapsulation layer 410, an organic encapsulation layer 420, and a second inorganic encapsulation layer 430. However, this is merely an example, and numbers of inorganic and organic layers constituting the encapsulation layer 400 may be variously changed. The first inorganic encapsulation layer 410, the organic encapsulation layer 420, and the second inorganic encapsulation layer 430 may be disposed in a portion of the non-display area NA and the display area DA. In an embodiment, the organic encapsulation layer 420 may be formed or provided around the display area DA, and the first inorganic encapsulation layer 410 and the second inorganic encapsulation layer 430 may be formed or provided up to the non-display area NA. The encapsulation layer 400, which is for protecting the light emitting diode LED from moisture or oxygen that may be introduced from the outside, may directly contact first ends of the first inorganic encapsulation layer 410 and the second inorganic encapsulation layer 430.

A buffer layer 501 may be disposed on the encapsulation layer 400. The buffer layer 501 may include an inorganic insulating layer, and an inorganic material included in the inorganic insulating layer may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. In an embodiment, the buffer layer 501 may be omitted.

A second sensing electrode connector 541, the first sensing insulating layer 510, and the plurality of sensing electrodes 520 and 540 may be disposed on the buffer layer 501. One of the first sensing electrode connectors 521 and the second sensing electrode connector 541 may be disposed in a same layer as that of the sensing electrodes 520 and 540, and the other may be disposed at a different layer from that of the sensing electrodes 520 and 540. Hereinafter, an example in which the second sensing electrode connector 541 is disposed at a different layer from that of the sensing electrodes 520 and 540 will be described.

The second sensing electrode connector 541, the first sensing insulating layer 510, and the sensing electrodes 520 and 540 may constitute a sensing sensor. The sensing sensor may be classified into a resistive type, a capacitive type, an electro-magnetic type, and an optical type. The sensing sensor in an embodiment may be a capacitive type of sensor.

The second sensing electrode connector 541 may be disposed on the buffer layer 501, and the first sensing insulating layer 510 may be disposed on the buffer layer 501 and the second sensing electrode connector 541. The first sensing insulating layer 510 may include an inorganic insulating material or an organic insulating material. An inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. An organic insulating material may include at least one of an acrylic resin, a methacrylic resin, a polyisoprene, a vinyl resin, an epoxy resin, a urethane resin, a cellulose resin, and a perylene resin.

The sensing electrodes 520 and 540 may be disposed on the first sensing insulating layer 510. The sensing electrodes 520 and 540 may include the first sensing electrodes 520 and the second sensing electrodes 540. The first sensing electrodes 520 and the second sensing electrodes 540 may be electrically insulated. An opening exposing an upper surface of the second sensing electrode connector 541 may be defined in the first sensing insulating layer 510, and the second sensing electrode connector 541 is connected to the second sensing electrodes 540 through the opening of the first sensing insulating layer 510 to electrically connect two adjacent second sensing electrodes 540. The first sensing electrode connector 521 connecting the first sensing electrodes 520 is formed or provided in a same layer as that of the first sensing electrodes 520 and the second sensing electrodes 540.

The sensing electrodes 520 and 540 may include a conductive material having good conductivity. In an embodiment, the sensing electrodes 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof, for example. The sensing electrodes 520 and 540 may be configured as a single layer or a multilayer. In this case, an opening may be defined in the sensing electrodes 520 and 540 so that light emitted from the light emitting diode is emitted upward without interference. In an embodiment, the sensing electrodes 520 and 540 may be configured as a triple layer including an upper layer, an intermediate layer, and a lower layer, where the upper layer and the lower layer may include titanium (Ti), and the intermediate layer may include aluminum (Al).

A second sensing insulating layer 530 may be disposed on the sensing electrodes 520 and 540 and the first sensing insulating layer 510. The second sensing insulating layer 530 may include an inorganic insulating material or an organic insulating material. In an embodiment, an inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. In an embodiment, an organic insulating material may include at least one of an acrylic resin, a methacrylic resin, a polyisoprene, a vinyl resin, an epoxy resin, a urethane resin, a cellulose resin, and a perylene resin.

A first insulating layer 550 is disposed on the second sensing insulating layer 530. The first insulating layer 550 may include a light-transmitting organic insulating material having a low refractive index. In an embodiment, the first insulating layer 550 may include at least one of an acrylic resin, a polyimide resin, a polyamide resin, and Alq3 [Tris (8-hydroxyquinolinato)aluminum], for example. The first insulating layer 550 may have a relatively smaller refractive index than that of a second insulating layer 560 to be described later. In an embodiment, the first insulating layer 550 may have a refractive index of about 1.40 to about 1.59, for example.

An opening 551 is defined in the first insulating layer 550. The opening 551 refers to a portion where the second sensing insulating layer 530 is not covered by the first insulating layer 550. The opening 551 of the first insulating layer 550 may overlap the pixel opening 351.

A distance S1 between the pixel opening 351 and the opening 551 of the first insulating layer 550 indicates a shortest distance between an edge of the pixel opening 351 and an edge of the opening 551. The edge of the pixel opening 351 refers to a point where an edge of the bank layer 350 contacts the pixel electrode 191. The edge of the opening 551 refers to a point where the edge of the first insulating layer 550 contacts the second sensing insulating layer 530.

The second insulating layer 560 may be disposed on the second sensing insulating layer 530 and the first insulating layer 550. The second insulating layer 560 may include a light-transmitting organic insulating material having a high refractive index. The second insulating layer 560 may have a relatively larger refractive index than that of the first insulating layer 550. In an embodiment, the second insulating layer 560 may have a refractive index of about 1.60 to about 1.80, for example.

The second insulating layer 560 may be disposed within the opening 551 of the first insulating layer 550. In this case, the second insulating layer 560 is in contact with a side surface of the first insulating layer 550. Furthermore, the second insulating layer 560 may also be disposed on an upper surface of the first insulating layer 550 so as to contact the upper surface of the first insulating layer 550.

Although not illustrated, a polarization layer including a linear polarizer and a retarder may be further disposed on the sensing area TA. In addition, a cover window for protecting the sensing area TA and the display area DA may be further disposed on the sensing area TA. In this case, an adhesive layer may be further disposed between the polarization layer and the cover window.

The sensing area TA may include the first insulating layer 550, in which the opening 551 is defined, and the second insulating layer 560 disposed in the opening 551 of the first insulating layer 550, thereby improving front visibility and light emission efficiency of the display device. That is, at least a portion of the light generated from the light emitting diode LED may be totally reflected at an interface between the first insulating layer 550 and the second insulating layer 560, thereby condensing light to the front.

Light L generated from the emission layer 370 may be emitted in various directions, and enters the sensing area TA with various incident angles. In this case, at least some of the light L incident on the second insulating layer 560 of the sensing area TA is reflected at the interface between the first insulating layer 550 and the second insulating layer 560. In particular, when an incident angle of the light L incident on the second insulating layer 560 is greater than a critical angle, the incident light L may be totally reflected at the interface between the first insulating layer 550 and the second insulating layer 560. That is, the light L that is incident on the second insulating layer 560 having a relatively large refractive index may travel to the first insulating layer 550 having a relatively small refractive index, and may be totally reflected at the interface between the first insulating layer 550 and the second insulating layer 560.

In this case, the interface between the first insulating layer 550 and the second insulating layer 560 may form a straight line parallel to the substrate 100 at a predetermined angle. The interface between the first insulating layer 550 and the second insulating layer 560 may be a side surface of the first insulating layer 550. Accordingly, the side surface of the first insulating layer 550 may be inclined at a predetermined inclination angle θ with respect to the upper surface of the second sensing insulating layer 530. That is, the side inclination angle θ of the first insulating layer 550 refers to an angle defined by the side surface of the first insulating layer 550 with respect to the upper surface of the second sensing insulating layer 530 in the opening 551 of the first insulating layer 550.

In the display device in an embodiment, the side inclination angle θ of the first insulating layer 550 in the opening 551 of the first insulating layer 550 may be different depending on a position. Hereinafter, the inclination angle θ of the side surface of the first insulating layer 550 depending on a position of the opening 551 of the first insulating layer 550 will be described with reference to FIG. 4 to FIG. 6.

Figure 4:
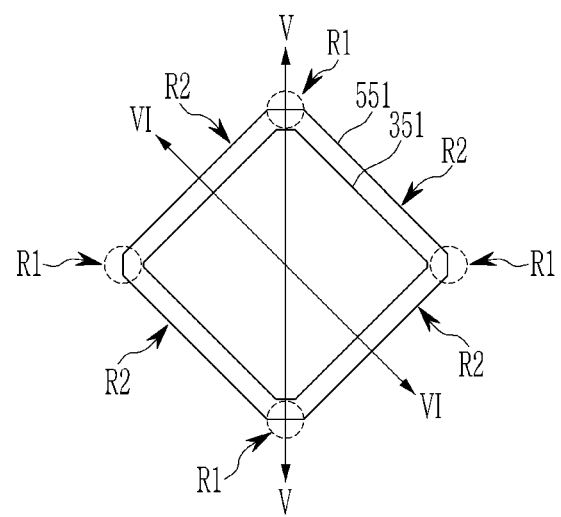
FIG. 4 partially illustrates a top plan view of an embodiment of a display device.
Figure 5:
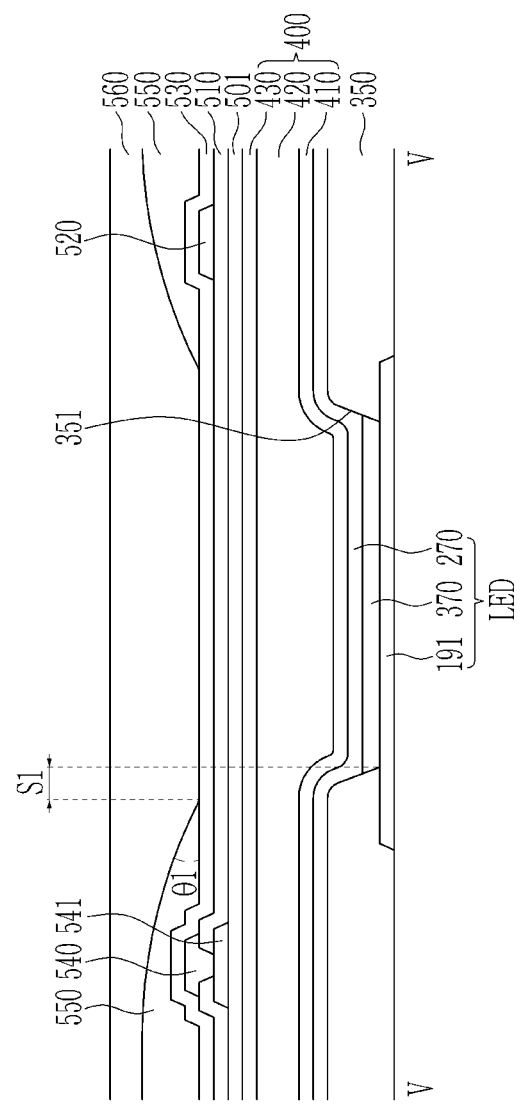
FIG. 5 illustrates a cross-sectional view taken along line V-V of FIG. 4.
Figure 6:
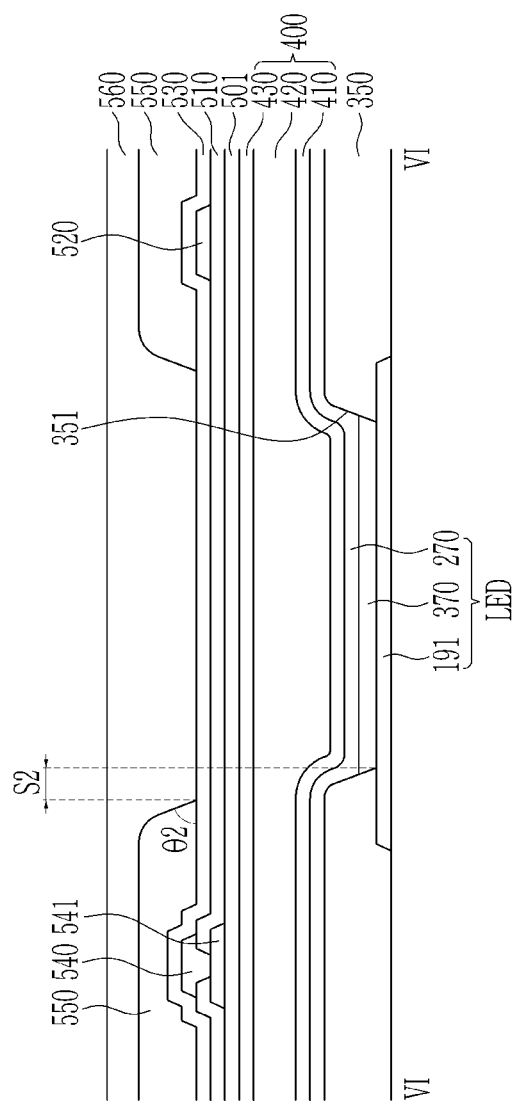
FIG. 6 illustrates a cross-sectional view taken along line VI-VI of FIG. 4.

FIG. 4 partially illustrates a top plan view of an embodiment of a display device, FIG. 5 illustrates a cross-sectional view taken along line V-V of FIG. 4, and FIG. 6 illustrates a cross-sectional view taken along line VI-VI of FIG. 4. FIG. 4 illustrates an embodiment of a pixel opening and an opening of the first insulating layer of the display device. FIG. 5 and FIG. 6 illustrate an embodiment of some layers of a display device. FIG. 5 and FIG. 6 illustrate an embodiment of the pixel electrode 191 and layers disposed thereon. That is, layers disposed under the pixel electrode 191 are omitted.

As illustrated in FIG. 4, the opening 551 of the first insulating layer 550 of the display device in an embodiment may have a substantially polygonal shape in a plan view.

In an embodiment, the opening 551 of the first insulating layer 550 may have a quadrangular shape in a plan view, for example. In this case, the opening 551 of the first insulating layer 550 may have a polygonal shape with a corner portion chamfered in a plan view. The corner portion of the opening 551 of the first insulating layer 550 may be chamfered in a straight line or a curved line. However, the planar shape of the opening 551 of the first insulating layer 550 is not limited thereto, and may be variously changed. In an embodiment, the opening 551 of the first insulating layer 550 may have a circular shape or an oval shape, for example.

An edge of the opening 551 of the first insulating layer 550 may include a first region R1 and a second region R2 in a plan view. The first region R1 may be a corner portion of the polygonal shape defining the opening 551 of the first insulating layer 550, and the second region R2 may be a portion other than the first region R1. A ratio of the first region R1 to the second region R2 at the edge of the opening 551 of the first insulating layer 550 may be less than 1.

As illustrated in FIG. 5 and FIG. 6, the side inclination angle θ1 of the first insulating layer 550 in the first region R1 may be different from a side inclination angle θ2 of the first insulating layer 550 in the second region R2. FIG. 5 illustrates the side inclination angle θ1 of the first insulating layer 550 in the first region R1, and FIG. 6 illustrates the side inclination angle θ2 of the first insulating layer 550 in the second region R2.

The side inclination angle θ1 of the first insulating layer 550 in the first region R1 may be smaller than the side inclination angle θ2 of the first insulating layer 550 in the second region R2. In an embodiment, the side inclination angle θ1 of the first insulating layer 550 in the first region R1 may be lower by 20 degrees or more than the side inclination angle θ2 of the first insulating layer 550 in the second region R2, for example. In the first region R1, the side inclination angle θ1 of the first insulating layer 550 may be designed to be about 50 degrees, and in the second region R2, the side inclination angle θ2 of the first insulating layer 550 may be designed to be about 70 degrees. In this case, assuming that a process error is at most 20 degrees, the side inclination angle θ1 of the first insulating layer 550 in the first region R1 may be about 30 degrees or more and about 70 degrees or less. The side inclination angle θ1 of the first insulating layer 550 in the first region R1 may be about 30 degrees or less. In addition, in the second region R2, the side inclination angle θ2 of the first insulating layer 550 may be about 50 degrees or more and about 90 degrees or less.

The opening 551 of the first insulating layer 550 may overlap the pixel opening 351. A planar shape of the pixel opening 351 may be similar to that of the opening 551 of the first insulating layer 550. The pixel opening 351 may have a substantially polygonal shape in a plan view. The pixel opening 351 may be defined inside the opening 551 of the first insulating layer 550 in a plan view. That is, the size of the opening 551 of the first insulating layer 550 may be larger than that of the pixel opening 351.

The distance S1 between the pixel opening 351 and the opening 551 of the first insulating layer 550 in the first region R1 may be different from a distance S2 between the pixel opening 351 and the opening 551 of the first insulating layer 550 in the second region R2. In an embodiment, the distance S1 between the pixel opening 351 and the opening 551 of the first insulating layer 550 in the first region R1 may be larger than the distance S2 between the pixel opening 351 and the opening 551 of the first insulating layer 550 in the second region R2, for example. However, the invention is not limited thereto, and the distance S1 between the pixel opening 351 and the opening 551 of the first insulating layer 550 in the first region R1 may be the same as the distance S2 between the pixel opening 351 and the opening 551 of the first insulating layer 550 in the second region R2.

Figure 8:
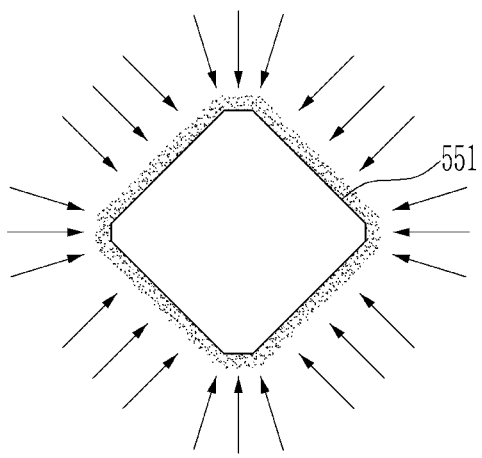
FIG. 8 illustrates an opening of a first insulating layer in a reference example of a display device.
Figure 9:
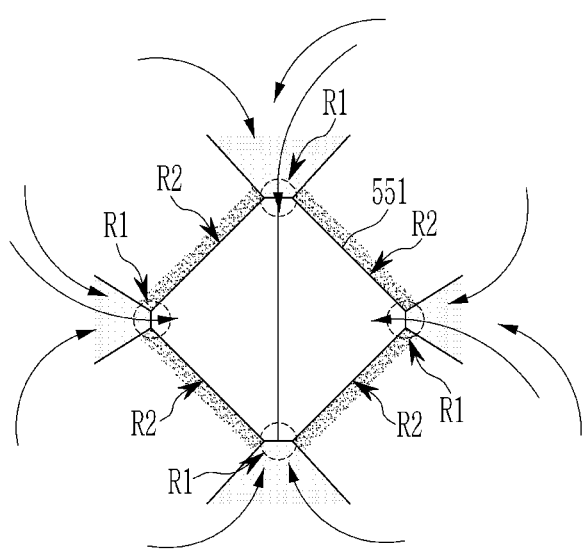
FIG. 9 illustrates an opening of an embodiment of a first insulating layer in a display device.

Hereinafter, an effect of forming the side inclination angle θ of the first insulating layer 550 differently depending on the position will be described with further reference to FIG. 7 to FIG. 9.

Figure 7:
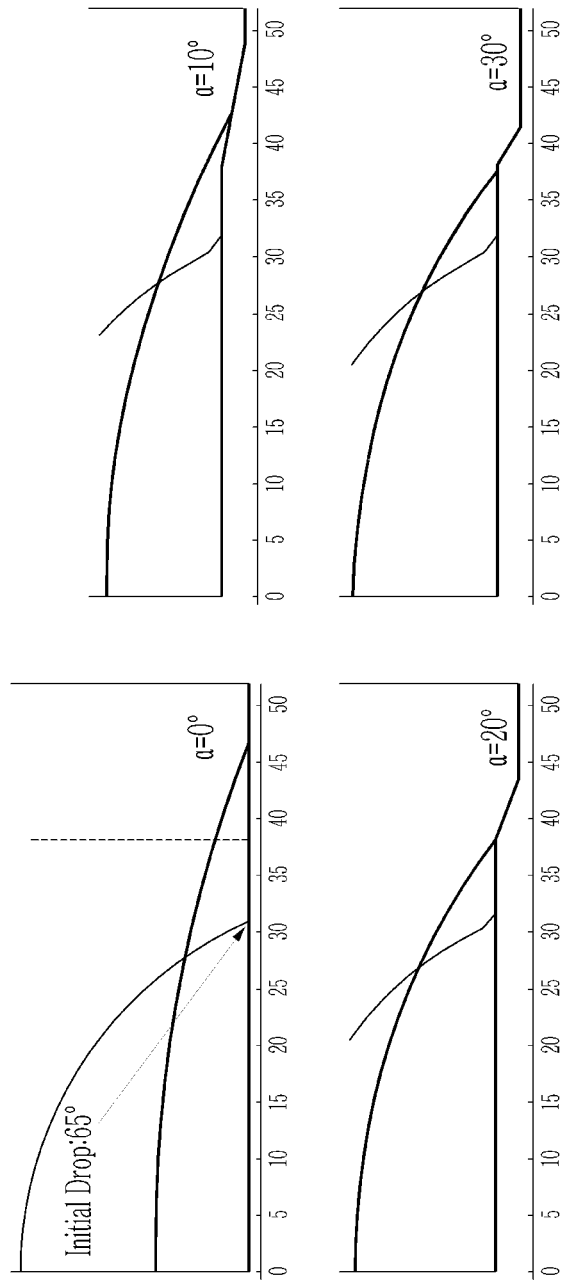
FIG. 7 illustrates fluidity of a material depending on an angle of a pattern when a predetermined material is applied onto a predetermined pattern.

FIG. 7 illustrates fluidity of a material depending on an angle of a pattern when a predetermined material is applied onto a predetermined pattern. FIG. 8 illustrates an opening of a first insulating layer in a reference example of a display device, and FIG. 9 illustrates an embodiment of an opening of a first insulating layer in a display device. In FIG. 8 and FIG. 9, a movement path of a material for forming a second insulating layer around an opening of the first insulating layer is illustrated.

As illustrated in FIG. 7, when a predetermined material is applied onto a predetermined pattern having an inclination angle α of about 0 degree, i.e., no inclination angle, the material may be smoothly spread. An initial angle at a point where a droplet is dropped is about 65 degrees, and it may be seen that it spreads smoothly from the point where the droplet is dropped. It may be seen that, when a predetermined material is applied onto a predetermined pattern having an inclination angle α of about 10 degrees, fluidity of the material is lowered compared to the case of about 0 degree. That is, the material applied onto the pattern moves to a point of the inclined portion, and then stops. When the inclination angle α of the predetermined pattern is more than about 20 degrees, the fluidity of the material is further lowered, so that the material applied onto the pattern cannot enter the inclined portion. That is, when the inclination angle α of the pattern is increased, the fluidity of the material applied onto the pattern may be lowered, thereby preventing the material from entering the inclined portion.

In the reference example of the display device, the side inclination angle of the first insulating layer may be constant, and in this case, the side inclination angle may be about 70 degrees or more. After the first insulating layer is formed or provided, a material for forming the second insulating layer may be applied to form the second insulating layer thereon. In this case, the material for forming the second insulating layer applied onto the first insulating layer may move in various directions. As illustrated in FIG. 8, in the reference example of the display device, the material for forming the second insulating layer may not enter the opening 551 of the first insulating layer due to a high side inclination of the first insulating layer. The first insulating layer may include a plurality of openings 551, and the material for forming the second insulating layer may not be disposed in some of the openings 551. Accordingly, in the reference example of the display device, the second insulating layer may not be entirely uniformly formed or disposed on the substrate. In this case, a method of thickly forming the second insulating layer may be considered in order to uniformly form the second insulating layer, and as a result, a thickness of the display device may be increased. In addition, other problems may occur in a post-process, and when applied to a foldable product, there are problems such as deterioration of impact resistance.

In the display device in the embodiment, the material for forming the second insulating layer may smoothly enter the opening 551 of the first insulating layer by forming a relatively low side inclination angle of the first insulating layer in the first region R1. That is, the movement path of the material for forming the second insulating layer may be formed or provided by the low inclination angle of the first insulating layer in the first region R1. The openings 551 may be defined in the first insulating layer, and the material for forming the second insulating layer may be entirely disposed in the openings 551. Accordingly, in the display device in the embodiment, the second insulating layer may be uniformly formed or provided with a thin thickness. Accordingly, an overall thickness of the display device may be reduced, problems occurring in post-processing may be solved, and it may be stably used for foldable products.

In addition, in the display device in the embodiment, light that is incident on the interface between the first insulating layer and the second insulating layer may be totally reflected and condensed to the front of the display device by forming a relatively high side inclination angle of the first insulating layer in the second region R2. That is, it is possible to improve light emission efficiency at the front of the display device.

In this case, a ratio of the first region R1 to the second region R2 at an edge of the openings 551 of the first insulating layer may be variously changed. In this case, the ratio of the first region R1 to the second region R2 may be less than 1. When the ratio of the first region R1 to the second region R2 is set too low, the movement path of the material for forming the second insulating layer may be reduced, so that uniform formation of the second insulating layer may be difficult. When the ratio of the first region R1 to the second region R2 is set too high, the light emission efficiency of the front of the display device may be relatively lowered. Accordingly, the ratio of the first region R1 to the second region R2 may be appropriately selected so as to increase the front emission efficiency of the display device while uniformly forming the second insulating layer. In an embodiment, the ratio of the first region R1 to the second region R2 may be about 1% or more and about 20% or less, for example.

Hereinafter, a photomask for defining an opening of a first insulating layer of a display device in an embodiment will be described with reference to FIG. 10 to FIG. 21.

FIG. 10 to FIG. 21 illustrate top plan views showing various embodiments of a photomask for defining an opening in a first insulating layer of a display device.

The first insulating layer of the display device in the embodiment may include a negative type of photosensitive material. First, the material for forming the first insulating layer is entirely applied, and after the photomask is matched, an exposure process is performed. In this case, a portion exposed to light remains in the first insulating layer, and a portion masked by a pattern of the photomask is removed to define an opening. However, the invention is not limited thereto, and the first insulating layer of the display device in the embodiment may include a positive type of photosensitive material. In this case, the pattern of the photomask for defining the opening of the first insulating layer may be reversely formed or provided.

Figure 10:
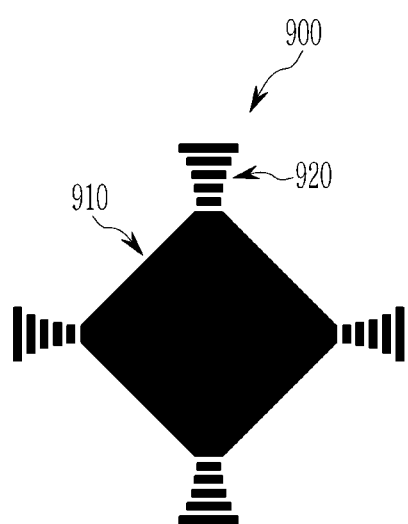
FIG. 10 to FIG. 21 illustrate top plan views showing various embodiments of a photomask for defining an opening in a first insulating layer of a display device.

As illustrated in FIG. 10, a photomask 900 for defining an opening of a first insulating layer of a display device in an embodiment may include a center pattern 910 having a substantially polygonal shape and a peripheral pattern 920 disposed adjacent to a corner portion of the center pattern 910.

The center pattern 910 may have a polygonal shape, e.g., a quadrangular shape. In this case, the corner portion of the center pattern 910 may be chamfered in a straight line or a curved line.

The peripheral pattern 920 may be disposed at each corner portion of the center pattern 910. When the center pattern 910 has the quadrangular shape, the peripheral pattern 920 may be disposed at each of the four corner portions of the center pattern 910. That is, four peripheral patterns 920 may be disposed adjacent to one center pattern 910.

The peripheral patterns 920 may be formed or provided in a form in which a plurality of rod shapes is arranged side by side. In this case, a length of the rods may gradually increase as they move away from the center pattern 910. A width of the rods may be constant.

As illustrated in FIG. 11 to FIG. 21, the photomask 900 for defining the opening of the first insulating layer of the display device in the embodiment may include the center pattern 910 and the peripheral pattern 920. A shape of the center pattern 910 in the photomask 900 illustrated in FIG. 11 to FIG. 21 is substantially the same as that of the photomask illustrated in FIG. 10, and a shape of the peripheral pattern 920 may be different from that of the photomask illustrated in FIG. 10. Hereinafter, various shapes of the peripheral pattern 920 will be described.

Figure 11:
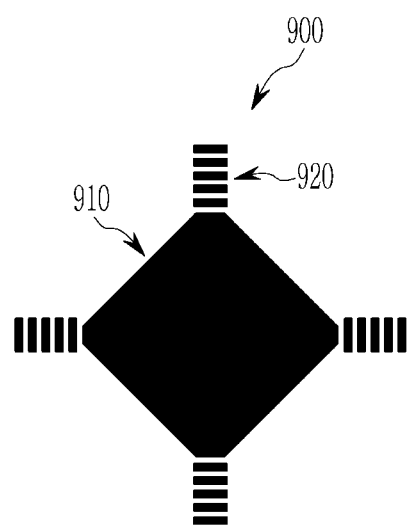

As illustrated in FIG. 11, the peripheral pattern 920 of the photomask 900 for defining the opening of the first insulating layer of the display device in the embodiment may be formed or provided in a form in which a plurality of rod shapes is arranged side by side. In this case, the rods may have a constant length. A width of the rods may be constant.

Figure 12:
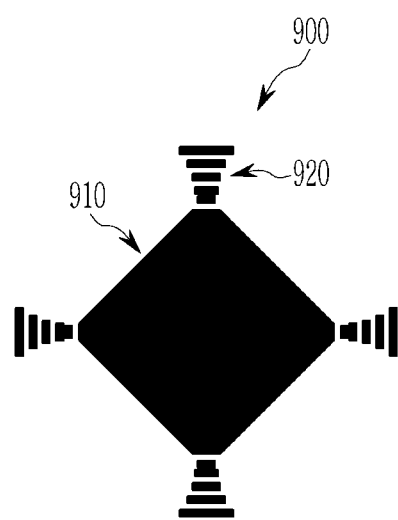

As illustrated in FIG. 12, the peripheral pattern 920 of the photomask 900 for defining the opening of the first insulating layer of the display device in the embodiment may be formed or provided in a form in which a plurality of rod shapes is arranged side by side. In this case, a length of the rods may gradually increase as they move away from the center pattern 910. A width of the rods may be constant. A distance between adjacent rods may gradually increase as a distance from the center pattern 910 increases.

Figure 13:
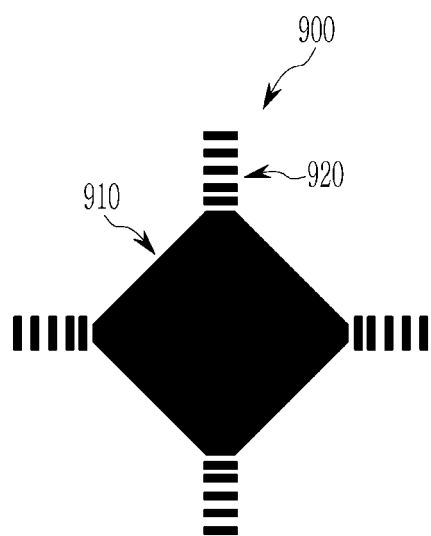

As illustrated in FIG. 13, the peripheral pattern 920 of the photomask 900 for defining the opening of the first insulating layer of the display device in the embodiment may be formed or provided in a form in which a plurality of rod shapes is arranged side by side. In this case, the rods may have a constant length. A width of the rods may be constant. A distance between adjacent rods may gradually increase as a distance from the center pattern 910 increases.

Figure 14:
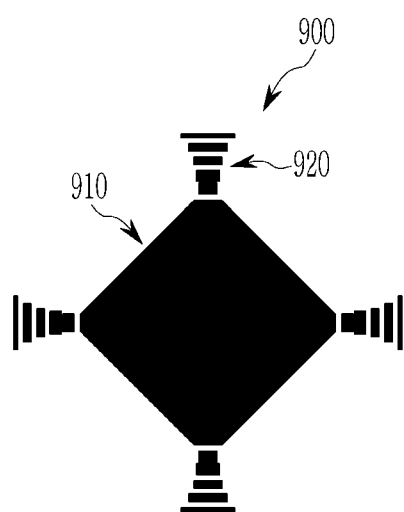

As illustrated in FIG. 14, the peripheral pattern 920 of the photomask 900 for defining the opening of the first insulating layer of the display device in the embodiment may be formed or provided in a form in which a plurality of rod shapes is arranged side by side. In this case, a length of the rods may gradually increase as they move away from the center pattern 910. A width of the rods may gradually decrease as they move away from the center pattern 910. A distance between adjacent rods may increase as the distance from the center pattern 910 increases.

Figure 15:
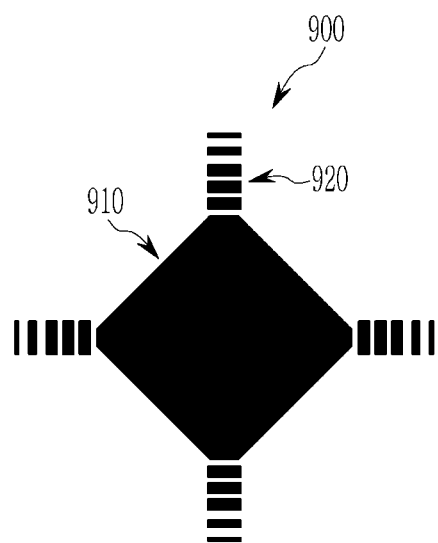

As illustrated in FIG. 15, the peripheral pattern 920 of the photomask 900 for defining the opening of the first insulating layer of the display device in the embodiment may be formed or provided in a form in which a plurality of rod shapes is arranged side by side. In this case, the rods may have a constant length. A width of the rods may decrease as the distance from the center pattern 910 increases. A distance between adjacent rods may increase as the distance from the center pattern 910 increases.

Figure 16:
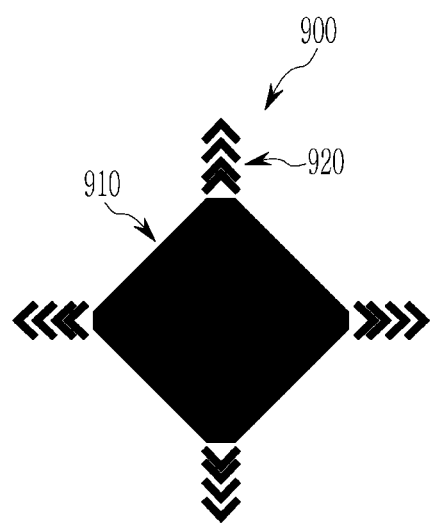

As illustrated in FIG. 16, the peripheral pattern 920 of the photomask 900 for defining the opening of the first insulating layer of the display device in the embodiment may be formed or provided in a form in which a plurality of rod shapes is arranged side by side. In this case, the rod shape may be formed or provided in a shape that is bent at least once. A length of the rods may be constant. A width of the rods may be constant. A distance between adjacent rods may increase as the distance from the center pattern 910 increases.

Figure 17:
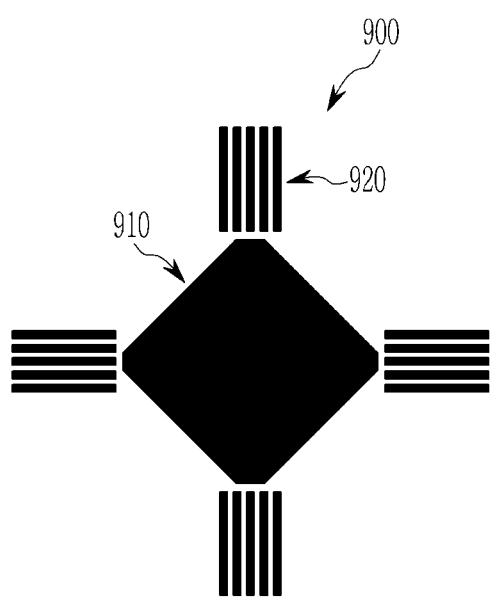

As illustrated in FIG. 17, the peripheral pattern 920 of the photomask 900 for defining the opening of the first insulating layer of the display device in the embodiment may be formed or provided in a form in which a plurality of rod shapes is arranged side by side. In this case, the rods may extend in a direction that is perpendicular to the corner portion of the center pattern 910. The length of the rods may be constant, and the width of the rods may be constant.

Figure 18:
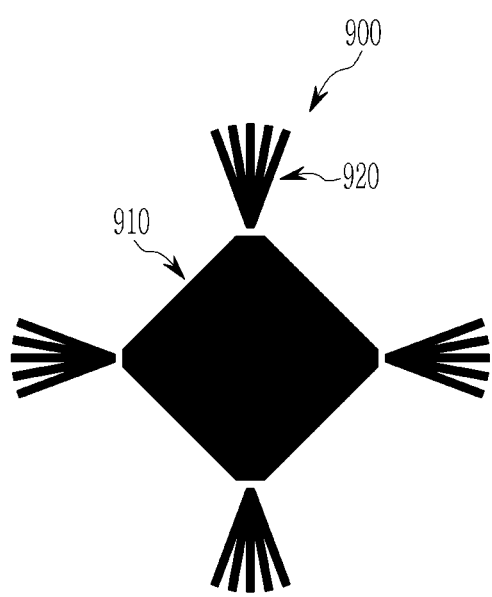

As illustrated in FIG. 18, the peripheral pattern 920 of the photomask 900 for defining the opening of the first insulating layer of the display device in the embodiment may be formed or provided in a form in which a plurality of rod shapes is arranged to have a fan shape. In this case, a first end of the rods is gathered at a point that is adjacent to the corner portion of the center pattern 910, and a second end of the rods is spaced apart at a predetermined interval. A length and a width of the rods may be constant.

Figure 19:
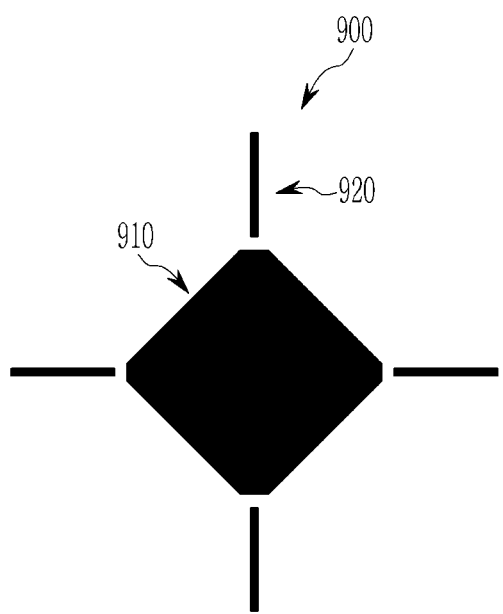

As illustrated in FIG. 19, the peripheral pattern 920 of the photomask 900 for defining the opening of the first insulating layer of the display device in the embodiment may have a rod shape. In this case, one rod shape may be disposed so as to be adjacent to each corner portion of the center pattern 910. The rods may extend in a direction that is perpendicular to the corner portion of the center pattern 910.

Figure 20:
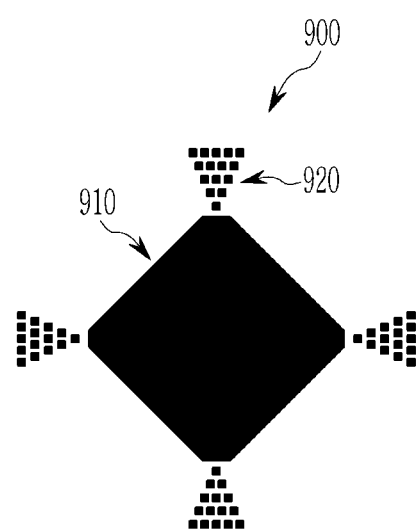

As illustrated in FIG. 20, the peripheral pattern 920 of the photomask 900 for defining the opening of the first insulating layer of the display device in the embodiment may be formed or provided in a form in which a plurality of quadrangles has a triangular shape. In this case, a number of quadrangles may increase as the distance from the corner portion of the center pattern 910 increases.

Figure 21:
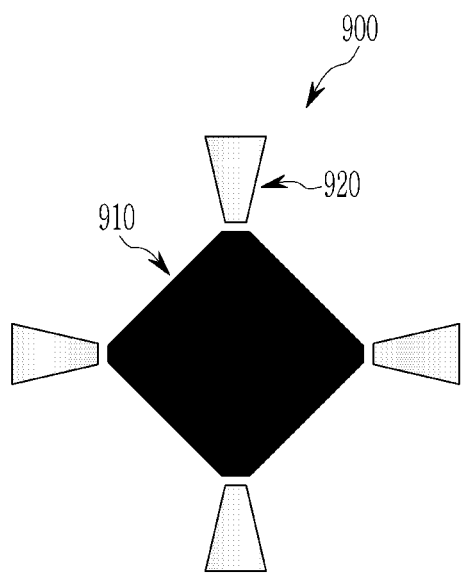

As illustrated in FIG. 21, the peripheral pattern 920 of the photomask 900 for defining the opening of the first insulating layer of the display device in the embodiment may have a trapezoid shape. In this case, the peripheral pattern 920 may gradually have a wider width as the distance from the center pattern 910 increases. In this case, the center pattern 910 may be a full-tone pattern, and the peripheral pattern 920 may be a half-tone pattern.

The opening of the first insulating layer of the display device in an embodiment may be defined by various photomasks 900 as illustrated in FIG. 10 to FIG. 21. In this case, an opening corresponding to the shape of the substantially center pattern 910 may be defined, and the opening may have relatively low inclination.

Next, a display device in an embodiment will be described with reference to FIG. 22.

Figure 22:
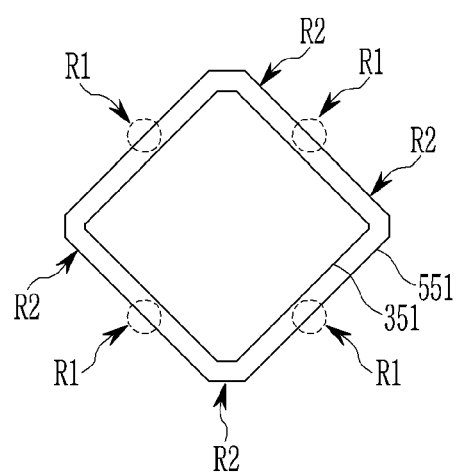
FIG. 22 partially illustrates atop plan view of an embodiment of a display device.

Since the display device in the embodiment illustrated in FIG. 22 is substantially the same as the display device in the embodiment shown in FIG. 1 to FIG. 6, a description of the same parts will be omitted. In the illustrated embodiment, the positions of the first region and the second region are different from those of the previous embodiment, and this will be further described below.

FIG. 22 partially illustrates a top plan view of a display device. FIG. 22 illustrates a pixel opening and an opening of the first insulating layer of the display device.

As illustrated in FIG. 22, the opening 551 of the first insulating layer of the display device in an embodiment may have a substantially polygonal shape in a plan view. In an embodiment, the opening 551 of the first insulating layer may be defined in a quadrangular shape, and each corner portion of the quadrangle may be chamfered in a straight line or a curved line, for example.

An edge of the opening 551 of the first insulating layer may include a first region R1 and a second region R2 in a plan view. The first region R1 may be a central portion of each side of a quadrangle defining the opening 551 of the first insulating layer 550, and the second region R2 may be a portion other than the first region R1. The second region R2 may include each corner portion of the quadrangle defining the opening 551 of the first insulating layer and a periphery thereof. In this case, the ratio of the first region R1 to the second region R2 may be less than 1.

A side inclination angle of the first insulating layer in the first region R1 may be smaller than a side inclination angle of the first insulating layer in the second region R2. In the previous embodiment, the first region R1 may be disposed at each corner portion of the quadrangle, and in the illustrated embodiment, the first region R1 may be disposed at a central portion of each side of the quadrangle.

Since the side inclination angle of the first insulating layer in the first region R1 is relatively low, the light emission efficiency toward the front in the first region R1 may be relatively low. In the previous embodiment, a corner portion having a relatively far distance between the pixel opening 351 and the opening 551 of the first insulating layer may be set as the first region R1, thereby minimizing a decrease in light emission efficiency. When the distance between the pixel opening 351 and the opening 551 of the first insulating layer is substantially the same in all regions, a position of the first region R1 may not significantly affect the light emission efficiency. Accordingly, the position of the first region R1 may be variously changed. In an embodiment, as in the illustrated embodiment, the first region R1 may be disposed at the central portion of each side of the quadrangle defining the opening 551 of the first insulating layer, or may be disposed at a point that is inclined to one side from the central portion, for example.

Next, a display device in an embodiment will be described with reference to FIG. 23 and FIG. 24.

Figure 23:
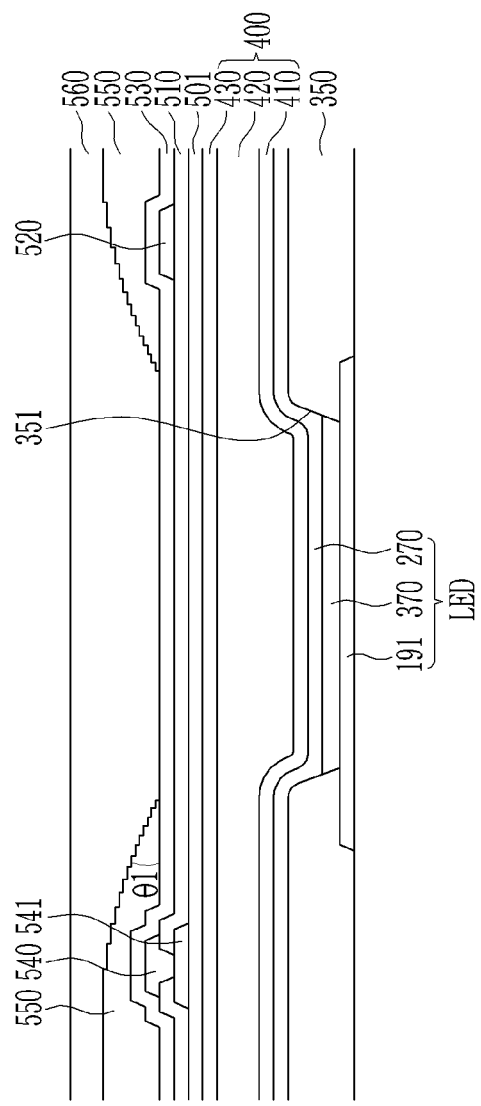
FIG. 23 and FIG. 24 illustrate an embodiment of some layers of a display device.
Figure 24:
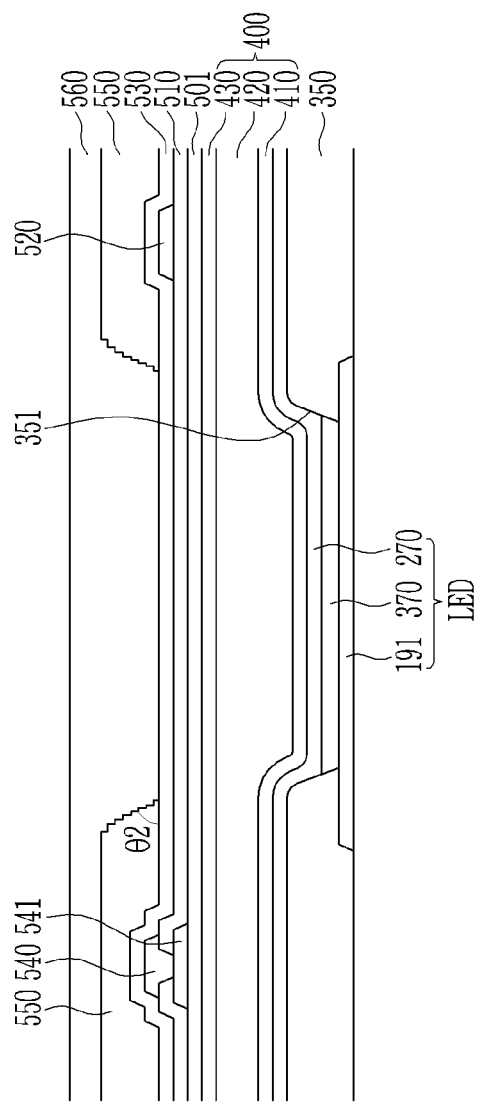

Since the display device in the embodiment illustrated in FIG. 23 and FIG. 24 is substantially the same as the display device in the embodiment shown in FIG. 1 to FIG. 6, a description of the same parts will be omitted. The illustrated embodiment differs from the previous embodiment in that the inclination of the side surface of the first insulating layer is made in a stepped shape, and will be further described below.

FIG. 23 and FIG. 24 illustrate an embodiment of some layers of a display device. As illustrated in FIG. 23 and FIG. 24, the side inclination angle θ1 of the first insulating layer 550 in the first region R1 may be different from a side inclination angle θ2 of the first insulating layer 550 in the second region R2. The side inclination angle θ1 of the first insulating layer 550 in the first region R1 may be smaller than the side inclination angle θ2 of the first insulating layer 550 in the second region R2. FIG. 23 illustrates the side inclination angle θ1 of the first insulating layer 550 in the first region R1, and FIG. 24 illustrates the side inclination angle θ2 of the first insulating layer 550 in the second region R2.

In the previous embodiment, the inclination of the side surface of the first insulating layer 550 may be formed or provided in a continuous straight line or curved shape. In the illustrated embodiment, the inclination of the side surface of the first insulating layer 550 may have a step shape. When the inclination of the side surface of the first insulating layer 550 has the step shape, the inclination angle of the side surface of the first insulating layer 550 may be an angle defined between a virtual line connecting successively disposed steps and an upper surface of the second sensing insulating layer 530.

The shape of the inclined portion of the side surface of the first insulating layer 550 is not limited thereto, and the shape of the photomask for patterning the first insulating layer 550, an exposure amount, an exposure time, a material constituting the first insulating layer 550, a type of developer, or the like may be variously changed.

Next, a display device in an embodiment will be described with reference to FIG. 25 to FIG. 27.

Figure 25:
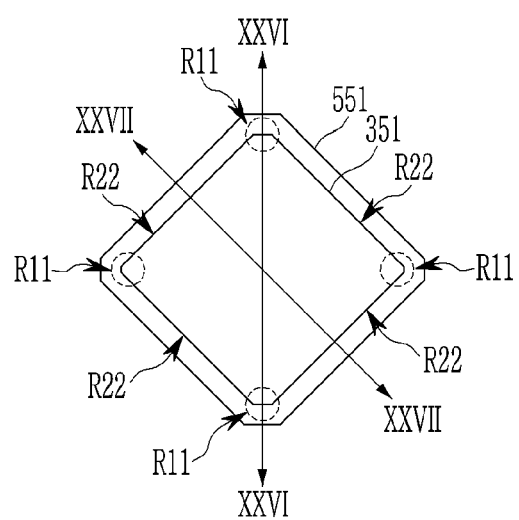
FIG. 25 partially illustrates atop plan view of an embodiment of a display device.
Figure 26:
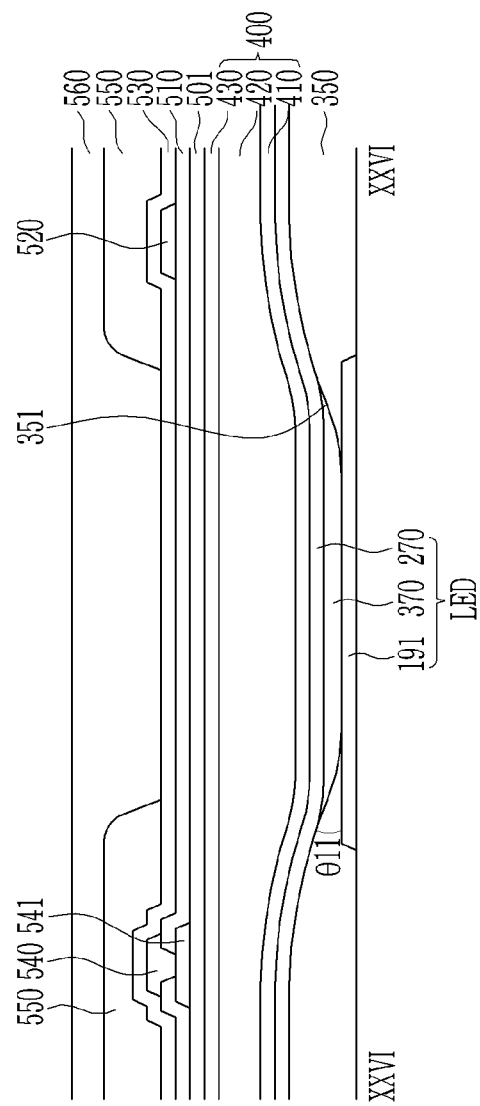
FIG. 26 illustrates a cross-sectional view taken along line XXVI-XXVI of FIG. 25.
Figure 27:
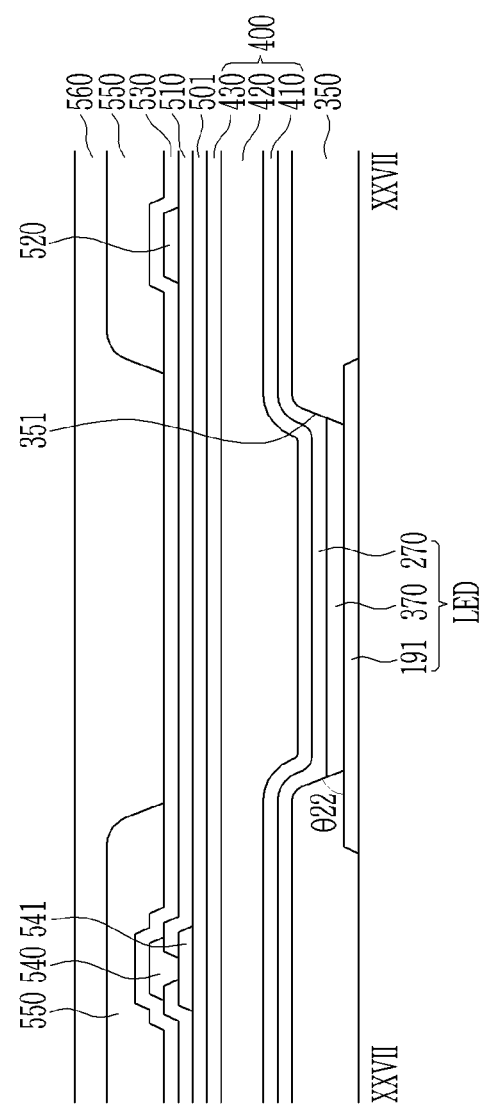
FIG. 27 illustrates a cross-sectional view taken along line XXVII-XXVII of FIG. 25.

Since the display device in the embodiment illustrated in FIG. 25 to FIG. 27 is substantially the same as the display device in the embodiment shown in FIG. 1 to FIG. 6, a description of the same parts will be omitted. The illustrated embodiment differs from the previous embodiment in that the inclination of the side surface of the bank layer is different depending on a position thereof, and will be further described below.

FIG. 25 partially illustrates a top plan view of an embodiment of a display device in an embodiment, FIG. 26 illustrates a cross-sectional view taken along line XXVI-XXVI of FIG. 25, and FIG. 27 illustrates a cross-sectional view taken along line XXVII-XXVII of FIG. 25. FIG. 25 illustrates an embodiment of a pixel opening and an opening of the first insulating layer of the display device. FIG. 26 and FIG. 27 illustrate an embodiment of some layers of a display device.

As illustrated in FIG. 25, the pixel opening 351 of the display device in the embodiment may have a substantially polygonal shape in a plan view. In an embodiment, the pixel opening 351 may have a quadrangular shape in a plan view, for example. In this case, the pixel opening 351 may have a polygonal shape having a chamfered corner in a plan view. In this case, the corner portion of the pixel opening 351 may be chamfered in a straight line or a curved line. However, the planar shape of the pixel opening 351 is not limited thereto, and may be variously changed. In an embodiment, the pixel opening 351 may have a circular shape or an oval shape, for example.

An edge of the pixel opening 351 may include a first region R11 and a second region R22 in a plan view. The first region R11 may be a corner portion of the polygonal shape forming the pixel opening 351, and the second region R22 may be a portion other than the first region R11. A ratio of the first region R11 to the second region R22 at the edge of the pixel opening 351 may be less than 1.

As illustrated in FIG. 26 and FIG. 27, a side inclination angle θ11 of the bank layer 350 in the first region R11 may be different from a side inclination angle θ22 of the bank layer 350 in the second region R2. FIG. 26 illustrates the side inclination angle θ11 of the bank layer 350 in the first region R1, and FIG. 27 illustrates the side inclination angle θ22 of the bank layer 350 in the second region R2.

The side inclination angle θ11 of the bank layer 350 in the first region R11 may be smaller than the side inclination angle θ22 of the bank layer 350 in the second region R2. In an embodiment, the side inclination angle θ11 of the bank layer 350 in the first region R11 may be lower by 20 degrees or more than the side inclination angle θ22 of the bank layer 350 in the second region R22, for example. In the first region R11, the side inclination angle θ11 of the bank layer 350 may be designed to be about 50 degrees, and in the second region R22, the side inclination angle θ22 of the bank layer 350 may be designed to be about 70 degrees. In this case, assuming that a process error is at most 20 degrees, the side inclination angle θ11 of the bank layer 350 in the first region R11 may be about 30 degrees or more and about 70 degrees or less. The side inclination angle θ11 of the bank layer 350 in the first region R11 may be about 30 degrees or less. In addition, in the second region R22, the side inclination angle θ22 of the bank layer 350 may be about 50 degrees or more and about 90 degrees or less.

The encapsulation layer 400 may be formed or disposed on the bank layer 350, and the encapsulation layer 400 may include an organic encapsulation layer 420. The side surface of the bank layer 350 has a constant inclination angle, and in the case of having a high inclination angle, the material for forming the organic encapsulation layer 420 may not enter the pixel opening 351 of the bank layer 350.

In the display device in the embodiment, the material for forming the bank layer 350 may smoothly enter the pixel opening 351 of the bank layer 350 by forming a relatively low side inclination angle of the bank layer 350 in the first region R11. That is, a movement path of the material for forming the encapsulation layer may be formed or provided by the low inclination angle of the bank layer 350 in the first region R11. A plurality of pixel openings 351 may be defined in the bank layer 350, and the material for forming the encapsulation layer may be entirely disposed in the pixel openings 351. Accordingly, in the display device in an embodiment, the encapsulation layer may be uniformly formed or provided with a thin thickness. Accordingly, an overall thickness of the display device may be reduced, problems occurring in post-processing may be solved, and it may be stably used for foldable products.

In the display device in an embodiment, the side inclination angle θ of the first insulating layer 550 in the opening 551 of the first insulating layer 550 may be constant. However, the invention is not limited thereto, and the side inclination angle of the first insulating layer 550 in the opening 551 of the first insulating layer 550 may be different according to a position.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the invention.

What is claimed is:

1. A display device comprising:
a substrate;
a pixel electrode disposed on the substrate;
a bank layer which is disposed on the pixel electrode and in which a pixel opening overlapping the pixel electrode is defined;
an encapsulation layer disposed on the pixel electrode and the bank layer;
a sensing electrode disposed on the encapsulation layer;
a first insulating layer which is disposed on the sensing electrode and in which an opening overlapping the pixel opening is defined; and
a second insulating layer which is disposed on the first insulating layer and has a higher refractive index than a refractive index of the first insulating layer,
wherein an edge of the opening of the first insulating layer includes a first region and a second region in a plan view, and
a side inclination angle, in a cross-sectional view, of the first insulating layer in the opening of the first insulating layer in the first region is different from a side inclination angle, in a cross-sectional view, of the first insulating layer in the opening of the first insulating layer in the second region different from the first region in the plan view,
the side inclination angle of the first region is defined by a side of the first insulating layer defining the edge of the first region of the opening and a surface of the substrate on which the first insulating layer is disposed, and
the side inclination angle of the second region is defined by a side of the first insulating layer defining the edge of the second region of the opening and the surface of the substrate.

2. The display device of claim 1, wherein
the side inclination angle of the first insulating layer in the first region is smaller than the side inclination angle of the first insulating layer in the second region.

3. The display device of claim 2, wherein
the opening of the first insulating layer has a polygonal shape,
the first region is a corner portion of the polygonal shape, and
the second region is a portion other than the first region.

4. The display device of claim 3, wherein
the opening of the first insulating layer has the polygonal shape in which a corner portion thereof is chamfered.

5. The display device of claim 4, wherein
the pixel opening is defined in the opening of the first insulating layer in a plan view.

6. The display device of claim 5, wherein
a distance between the pixel opening and the opening of the first insulating layer in the first region is greater than a distance between the pixel opening and the opening of the first insulating layer in the second region.

7. The display device of claim 2, wherein
a ratio of the first region to the second region at the edge of the opening of the first insulating layer is less than 1.

8. The display device of claim 2, wherein
the side inclination angle of the first insulating layer in the first region is smaller than the side inclination angle of the first insulating layer in the second region by about 20 degrees or more.

9. The display device of claim 2, wherein
the first insulating layer in the first region has the side inclination angle of about 70 degrees or less.

10. The display device of claim 2, wherein
the first insulating layer in the second region has the side inclination angle of about 50 degrees or more and about 90 degrees or less.

11. The display device of claim 2, wherein
the opening of the first insulating layer has a polygonal shape,
the first region is a central portion of each side of the polygonal shape, and
the second region is a portion other than the first region.

12. The display device of claim 2, wherein
a side inclination of the first insulating layer has a straight line, a curved line, or a stepped shape.

* * * * *